United States Patent [19]
Frank et al.

[11] Patent Number: 5,696,002
[45] Date of Patent: Dec. 9, 1997

[54] METHOD FOR FORMING ELECTRICAL CONTACT TO THE OPTICAL COATING OF AN INFRARED DETECTOR FROM THE BACKSIDE OF THE DETECTOR

[75] Inventors: Steven N. Frank, McKinney; James F. Belcher; Charles E. Stanford, both of Plano; Robert A. Owen; Robert J. S. Kyle, both of Rowlett, all of Tex.

[73] Assignee: Texas Instruments Incorporated, Dallas, Tex.

[21] Appl. No.: 635,047

[22] Filed: Apr. 19, 1996

Related U.S. Application Data

[62] Division of Ser. No. 396,944, Mar. 1, 1995.

[51] Int. Cl.⁶ ............................................. H01L 31/18
[52] U.S. Cl. .................... 437/2; 437/3; 437/228 SEN; 437/180; 437/974; 437/67
[58] Field of Search .............................. 437/2, 3, 5, 67, 437/180, 189, 203, 228 TR, 228 SEN, 974; 257/444; 250/332, 338.4

[56] References Cited

U.S. PATENT DOCUMENTS

| | | | |
|---|---|---|---|
| 4,570,329 | 2/1986 | Paine et al. | 148/DIG. 80 |
| 4,740,700 | 4/1988 | Shaham et al. | 250/332 |
| 5,304,500 | 4/1994 | Timlin et al. | 437/5 |
| 5,424,544 | 6/1995 | Shelton et al. | 250/332 |
| 5,436,450 | 7/1995 | Belcher et al. | 250/332 |
| 5,457,318 | 10/1995 | Robinson et al. | 250/332 |
| 5,470,761 | 11/1995 | McKee et al. | 437/3 |
| 5,485,010 | 1/1996 | Owen et al. | 250/332 |
| 5,521,104 | 5/1996 | Walker | 437/3 |
| 5,548,118 | 8/1996 | Walker | 250/332 |

FOREIGN PATENT DOCUMENTS 2246907  12/1990  Japan ................................... 437/3

Primary Examiner—John Niebling
Assistant Examiner—S. Mulpuri
Attorney, Agent, or Firm—Kay Houston; James W. Brady; Richard L. Donaldson

[57] ABSTRACT

This is a system and method of forming an electrical contact to the optical coating of an infrared detector. The method may comprise: forming thermal isolation trenches 22 in a substrate 20; depositing a trench filler 24 in the thermal isolation trenches 22; depositing a common electrode layer 31 over the thermal isolation trenches 22; depositing an optical coating 26 above the common electrode layer 31; mechanically thinning the substrate to expose the trench filler 24; etching to remove the trench filler 24 in the bias contact area; depositing a contact metal 34 on the backside of the substrate 20, wherein the contact metal 34 connects to the common electrode layer 31 at bias contact areas 34 around a periphery of the thermal isolation trenches; and etching the contact metal 34 and the trench filler 24 to form pixel mesas of the contact metal 34 and the substrate 20. Bias contact vias 23 may be formed in the bias contact areas and then filled with bias contact metal 49. Alternately, the bias contact vias may also be filled with the contact metal 34. The thermal isolation trenches may be formed by laser vaporization, ion milling or other equivalent methods. In addition, an elevation layer may be formed between the optical coating and the substrate to provide greater tolerances for ion milling. The elevation layer may be filled with a trench filler and then removed after milling. Alternately, the elevation layer may be filled with a metal 49 to connect the bias contact metal to the common electrode in the bias contact areas.

6 Claims, 5 Drawing Sheets

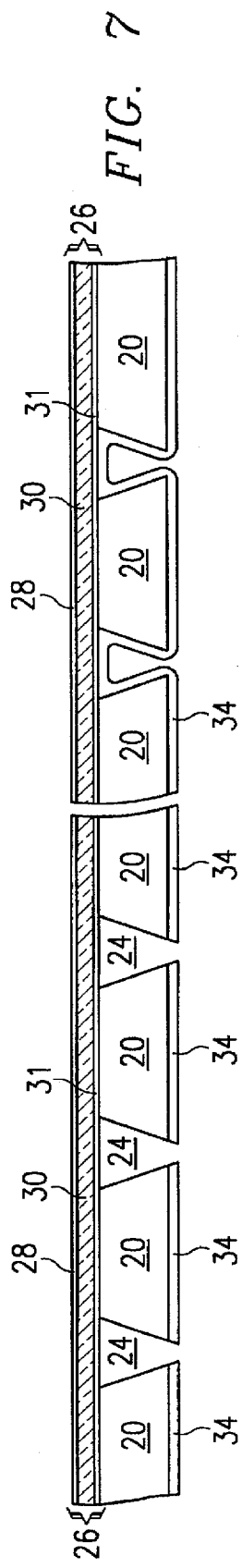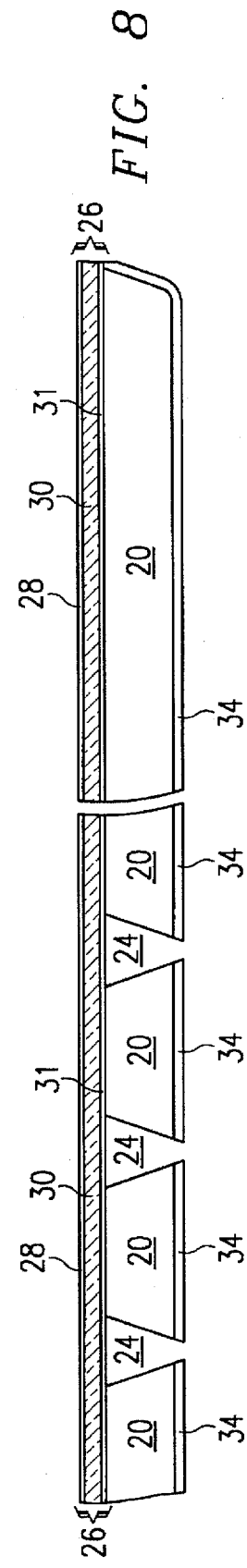

METHOD FOR FORMING ELECTRICAL CONTACT TO THE OPTICAL COATING OF AN INFRARED DETECTOR FROM THE BACKSIDE OF THE DETECTOR

This is a divisional of application Ser. No. 08/396,944, filed Mar. 1, 1995, which is now pending.

CROSS-REFERENCE TO RELATED APPLICATION

The following coassigned patent application is hereby incorporated herein by reference:

| Serial No. | Filing Date | TI Case No. |
|---|---|---|
| 08/223,073 | 04/04/94 | TI-18726 |
| 08/223,087 | 04/04/94 | TI-17847 |
| 08/223,088 | 04/04/94 | TI-18727 |

FIELD OF THE INVENTION

This invention generally relates to infrared (IR) detector arrays and means of fabrication.

BACKGROUND OF INVENTION

The novel IR devices and fabrication processes to be described are related to the types of IR detector arrays recorded in (1) U.S. Pat. No. 4,080,532, Hopper, 3/1978; (2) U.S. Pat. No. 4,745,278, Hanson, 5/1988; (3) U.S. Pat. No. 4,792,681, Hanson, 12/1988; (4) "LOW-COST UNCOOLED FOCAL PLANE ARRAY TECHNOLOGY", by Hanson, Beramn, Owen and Sweetser; presented Aug. 17, 1993 at the IRIS Detector Specialty Review; (5) cross-referenced patent application Ser. No. 08/223,087, filed Apr. 4, 1994, (6) cross-referenced patent application Ser. No. 08/223,088, filed Apr. 4, 1994, and (7) cross-referenced patent application Ser. No. 08/223,073, filed Apr. 4, 1994.

The physical requirements of uncooled arrays and a description of fabrication processes are covered in some detail in the above references. A line scanner may contain from several hundred to a few thousand and an area imager several thousand to tens of thousand individual picture elements (pixels.) Each of these pixels consists of a capacitor that has a heat (IR intensity) sensitive dielectric such ms barium titanate (BST.) The electronic connections to these capacitors are greatly simplified if one of the capacitor terminals is made common to all. Previously described in the references are methods to attach hundreds to tens of thousands of electrical connections between the other isolated terminals of the pixel capacitors and the electronic sensing circuitry housed on an external integrated circuit (IC.) In addition, the pixel capacitors must be thermally isolated from each other while having one terminal connected to all the other common terminals.

The common connection to one side of the pixel capacitors consists of a front side thin film referred to as the optical coating. This may be a composite of a plurality of thin films having the desired physical properties, such as IR transparency, electrical conductivity, thermal conductivity, etc. The thicker heat sensitive dielectric substrate in this case can be barium-strontium-titanate (BST) which is a ceramic like material.

SUMMARY OF THE INVENTION

Most of the previous inventions are concerned with how to achieve thermally isolated pixels and attach them to a companion silicon integrated circuit without damage to the fragile IR sensing array circuitry. The IR sensing side of the array contains the previously mentioned optical coating. This typically consists of three or four layers. The outermost layer is a semitransparent thin metal film such as nichrome (NiCr). The underlying wavelength tuning layer has a thickness of an odd number of quarter wavelengths at the desired IR wavelength. This tuning layer is transparent to IR and may be parylene. The underlying metal completes the optical filter properties and may also be the sole electrical contact for a common electrical connection to all the pixels. Typically this layer is a thicker film of NiCr. An improved structure, such as described in the references, may have a more rugged fourth layer. Sometimes this fourth layer results in a structure referred to as an elevated optical coating.

Although much detail and many variants of the pixel isolation and connection processes are described in the references, not mentioned is the method whereby the common electrode of the optical layer is electrically connected to a voltage or current biasing supply. Heretofore this has been accomplished in a very primitive and unreliable manner by physically scraping away the top two coatings of the optical layer at the periphery of the IR sensing array and attaching a free wire with electrically conducting epoxy.

This invention describes novel means of effecting this common electrode biasing connection in a more production worthy and reliable manner. This is a system and method of forming an electrical contact to the optical coating of an infrared detector. The method may comprise: forming thermal isolation trenches in a substrate; depositing a trench filler in the thermal isolation trenches; depositing a common electrode layer over the thermal isolation trenches; depositing an optical coating above the common electrode layer; mechanically thinning substrate to expose trench filler, etching a backside of the substrate to remove the trench filler in the bias contact area; depositing a contact metal on the backside of the substrate, wherein the contact metal connects to the common electrode layer at bias contact areas around a periphery of the thermal isolation trenches; and etching the contact metal and the trench filler to form pixel mesas of the contact metal and the substrate. Bias contact vias may be formed in the bias contact areas and then fried with bias contact metal.

Alternately, the bias contact vias may also be fried with contact metal. The thermal isolation trenches may be formed by laser vaporization, ion milling or other equivalent methods. In addition, an elevation layer may be formed between the optical coating and the substrate to provide greater tolerances for ion milling. The elevation layer may be filled with a trench filler and then removed after milling. Alternately, the elevation layer may be filled with a metal to connect the bias contact metal to the common electrode in the bias contact areas. In addition, this system and method may be applied to uncooled as well as cooled infrared detectors.

DESCRIPTION OF THE DRAWINGS

This invention can be best understood by reference to the following drawing(s), in which:

FIG. 7 shows the final array structure after the contact metal has been patterned and the trench filler has been removed;

FIG. 8 shows an alternate embodiment of the final array structure; and

Corresponding numerals and symbols in different figures refer to corresponding parts unless otherwise indicated.

DETAILED DESCRIPTION OF PREFERRED EMBODIMENTS

Figure 1:
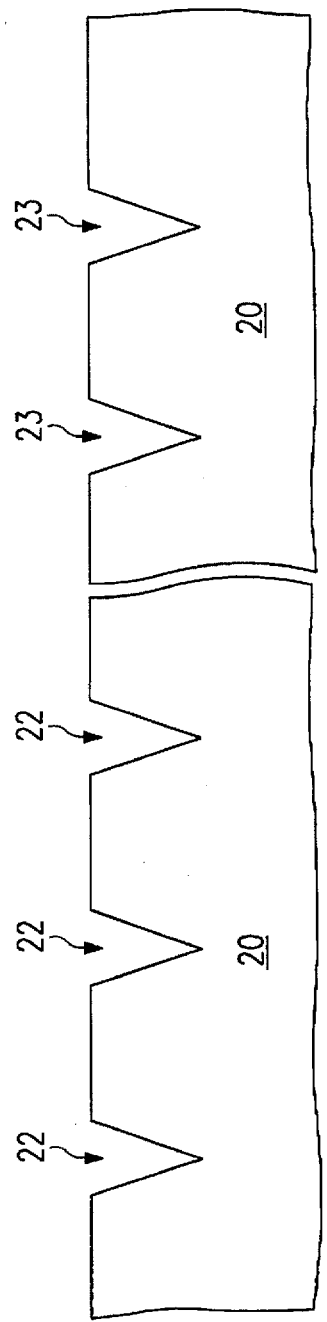
FIG. 1 shows a cross sectional sketch of an array after bias contact vias and thermal isolation trenches have been patterned and etched.

One preferred embodiment will be described with the aid of FIGS. 1–7 and TABLE 1. The figures have exaggerated layer thicknesses for descriptive purpose and are not to actual or relative scale to each other. In this embodiment, the BST substrate 20 is patterned from the front or optically sensitive side of the sensing array by the use of a laser to vaporize the substrate thereby forming thermal isolation trenches 22 between the thermally sensitive picture elements (pixels). As shown in FIG. 1, the vias 23 for the biasing contacts are formed in the same manner. These vias 23 are removed from the IR sensing area and have multiple locations around the border of the array. Although shown in these figures to be the same size as the thermal isolation trenches 22, these vias 23 may be larger if desired.

Figure 2:
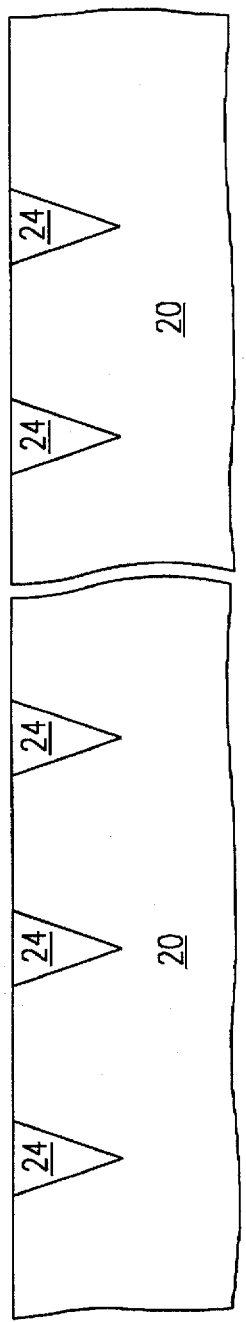
FIG. 2 shows a cross sectional sketch of an array after the bias contact vias and thermal isolation trenches have been fried with a trench filler and re-planarized.

FIG. 2 exhibits the structure after several processing steps have been completed from FIG. 1. Trenches 22 have been fried with parylene 24 and the surface has been mechanically polished to planarize the front side of the IR detector.

Figure 3:
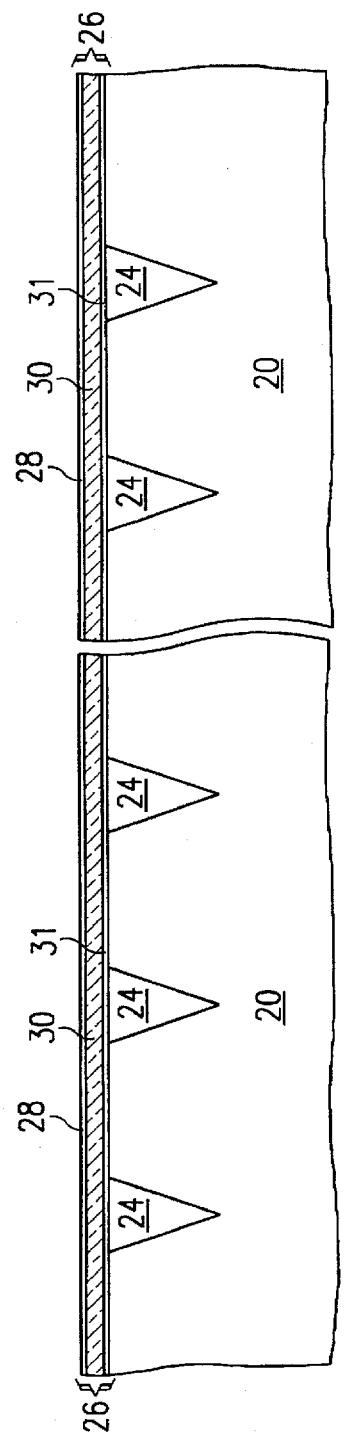
FIG. 3 shows the optical coating applied over the sensing and common biasing contact area.

After planarization, a three level optical coating 26 is deposited over all the pixels and bias contact vias 23 as shown in FIG. 3. The materials and thicknesses are shown in TABLE 1. The common electrode in this case is 31 and provides the functions of one side of the pixel capacitors and the electrical contact in the bias contact areas.

Figure 4:
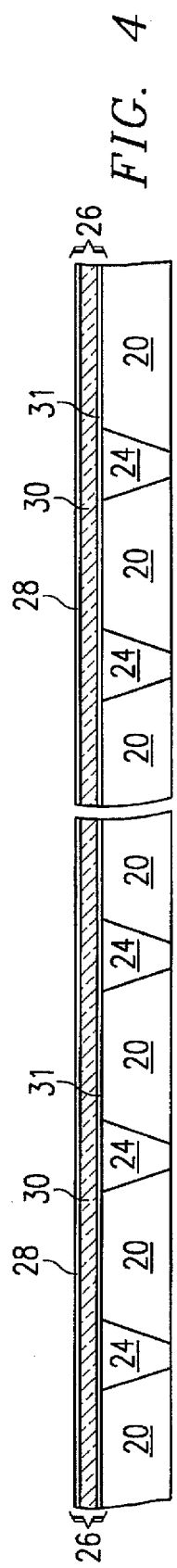
FIG. 4 depicts the mechanically thinned composite array with biasing contact area.

In FIG. 4, the substrate 20 has been thinned from the back side by mechanical polishing means to expose the parylene 24.

Figure 5:
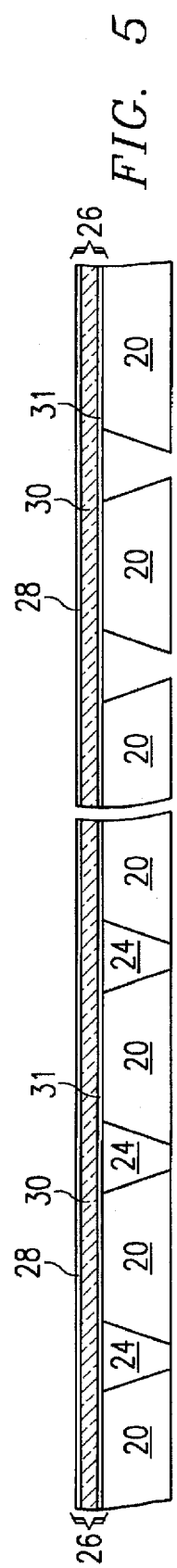
FIG. 5 shows a cross sectional sketch of the sensing array after the trench filler in the bias contact area has been removed.

FIG. 5 shows the array after removal of the parylene from the bias contact vias.

Figure 6:
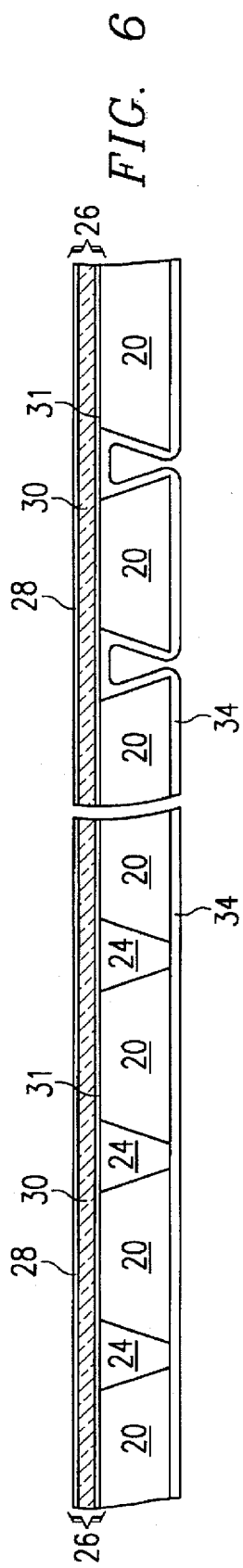
FIG. 6 indicates the application of contact metal to the backside of the array including the biasing contact.

FIG. 6 shows the deposition of the back side contact metal 34 which typically consists of the alloys shown in TABLE 1. This metal 34 acts as a backside contact metal in the thermal sensing areas, as well as an bias contact metal in the bias contact areas.

After the use of standard photolithography, etching and cleaning techniques, and bumpbonding to an IC, the structure shown in FIG. 7 results. The capacitor pixel mesas 20 are defined by the optical coating 26, the thermally sensitive insulator 20 and the contact metal 34. IC bonding may now be performed to all the pixel mesas and the biasing pads. This establishes an electrical connection for the common pixel electrode bias voltage through 34 to 31.

TABLE 1

| ID # | Description | Material (dim) | Alternates |
|---|---|---|---|
| 20 | Thermally sensitive substrate | Barium strontium titanate | |
| 22 | Isolation trenches | Laser vaporized | Ion milled |
| 23 | Bias contact vias | Laser vaporized | Ion milled |
| 24 | Trench filler | Parylene | Photoresist, PMMA, epoxy |
| 26 | Optical coating | 3 layered | 1/4 IR wavelength |
| 28 | Transparent coat | NiCr 50 A | 25–100 A |
| 30 | 1/4 wavelength separator coat | Parylene 1.4 μm | 1/4 wavelength at desired IR |
| 31 | Electrical conducting coat | NiCr 1000 A | 500–2000 A |
| 34 | Backside electrical contact | Multiple alloys suitable for IC bonding. | 4-layer composite of 15–60 μm In 0.5–1.5 μm Au 0.5–1.5 μm NiCr 0.2–1.0 μm TiW |

Whether the isolation trenches are formed by laser vaporization, ion milling or other means, similar trenches may be patterned at the periphery of the array at the same time. In addition, the bias contact vias may be filled with an appropriate metal, such as indium. The metal in this case would provide an electrical contact from the common conductor 31 of the optical coating to the backside electrical contact 34.

Another alternate embodiment is shown in FIG. 8. This embodiment omits etching bias contact vias and connects the common conductor 31 of the optical coating directly to the electrical conducting metal 34 on the end of the bias contact area. This could be implemented by making a bias contact via and removing the outer material after bond. All variants and combinations of these structures are considered within the scope of this invention.

Another preferred embodiment will be described with the aid of FIGS. 9–12 and TABLE 2. The thicknesses of the films are oversized and not to absolute or relative scale to each other. This IR imager has an elevated optical-coating and a common electrode on the sensing surface. In the fabrication process, the thermal isolation of the pixel capacitors is achieved from the backside by ion milling. It is shown that the biasing connection vias can be achieved in the same manner as the isolation trenches and become part of the normal process flow.

Figure 9:
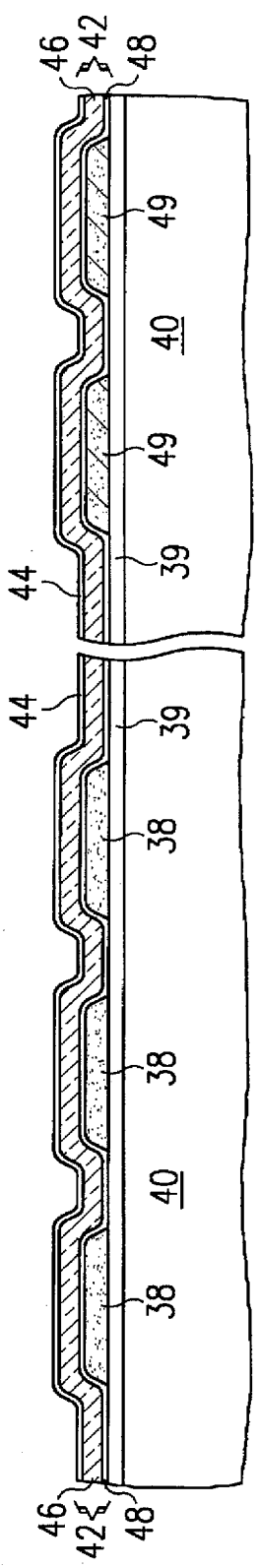
FIG. 9 shows a cross sectional area of an elevated optical coating over a common electrode with bias contact area.

In FIG. 9 several process steps have been completed. The common electrode 39 has already been deposited on the BST substrate 40. The organic elevation layer 38 for the optical coating 42 has already been deposited and patterned by normal photolithography. Although drawn to the same size, the bias contact areas covered with a metal 49 are at the outer edges of the array and do not have to be the same size. The optical coating 42 consists of 3 layers 44, 46, 48 as previously described with different identification numbers but is described again in TABLE 2.

TABLE 2

| ID # | Description | Material (dim) | Alternates |
|---|---|---|---|
| 38 | Organic elevation layer | PIRL 500–4000 A | Photoresist, parylene |
| 40 | Substrate | BST | |
| 42 | Optical coating | 3 layered | 1/4 IR wavelength |
| 44 | Transparent coat | NiCr 50 A | 25–100 A |
| 46 | 1/4 wavelength separator coat | Parylene 1.4 μm | 1/4 wavelength at desired IR signal |
| 48 | Electrical conducting coat | NiCr 1000 A | 500–2000 A |

TABLE 2-continued

| ID # | Description | Material (dim) | Alternates |
|------|-------------|----------------|------------|
| 49 | Bias contact metal | Indium | 4 layer composite of 15–60 μm In 0.5 . 1.5 μm Au 0.5–1.5 μm NiCr 0.2–1.0 μm TiW |
| 50 52 54 56 58 | Backside electrical contact | Bonding Alloys such as TiW and Au | 4 layer composite of 15–60 μm In 0.5–1.5 μm Au 0.5–1.5 μm NiCr 0.2–1.0 μm TiW |
| 60 | Adhesive | Wax | |
| 62 | Mechanical carrier | | |
| 64 66 68 70 | Etch mask for ion milling isolation trenches | Tri-level organic process 1.5 μm | Photoresist 1–2 μm TiW 500–1500 A Photoresist 8–20 μm |
| 72 | Isolation trench | | |
| 73 | Via for bias contact | | |
| 74 | Mask for bias metal | | |
| 75 | Bias contact metal | Indium | 4 layer composite of 15–60 μm In 0.5–1.5 μm Au 0.5–1.5 μm NiCr 0.2–1.0 μm TiW |
| 76 | Ohmic connection for pixels | TiW | |
| 77 | IC contact mesa for sensing connection | Photosensitive polyimide, Dupont 2734 | PMMA |
| 78 | IC via for sensing circuit | | |
| 80 | IC processor | Si or GaAs | |
| 82 | IC contact mesa for biasing connection | Photosensitive polyimide, Dupont 2734 | PMMA |
| 84 | Ohmic connection for bias connection | TiW | |
| 86 | IC via for bias circuit | | |

Figure 10:
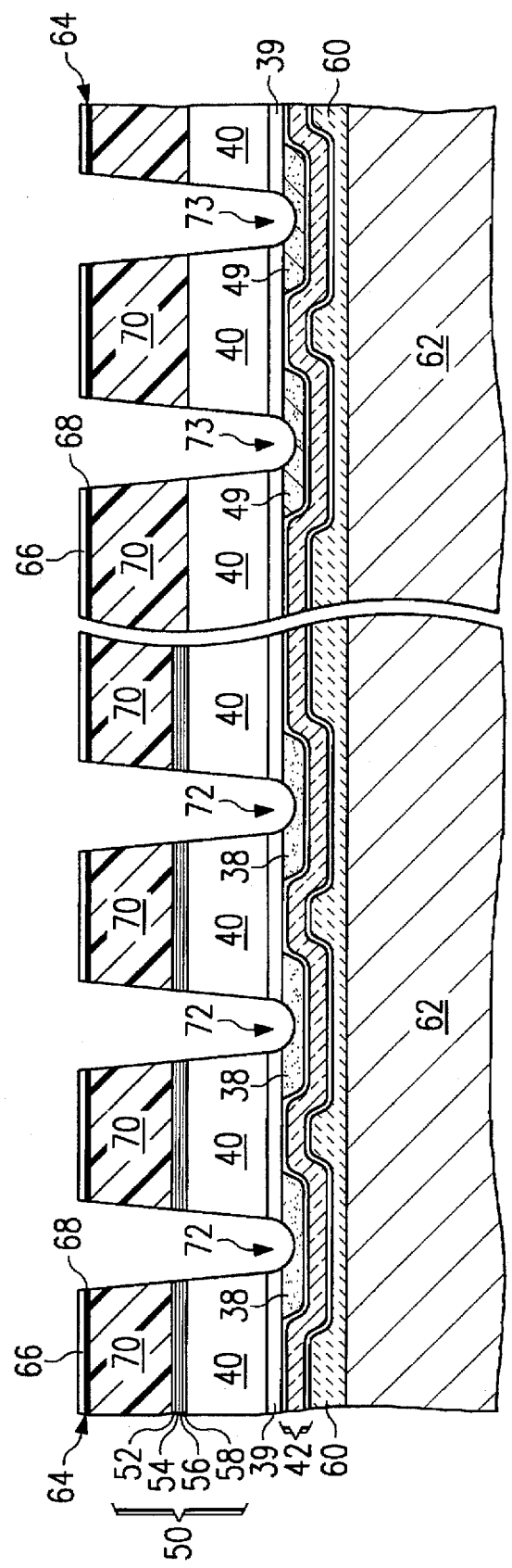
FIG. 10 shows the array after pixel thermal isolation has been performed by means of ion milling.

In FIG. 10, several steps have been accomplished along the backside of the IR imager. First, a contact metal 50 has been deposited on top the substrate. Next, a tri-level photoresist 64 is deposited and patterned. The tri-level photoresist 64 is used as a mask for the ion milling of the contact metal 50, thermal isolation trenches 72 and the bias vies 73. This resist consists of three layers 66, 68, 70. The contact metal 50 is comprised of layers 52, 54, 56 and 58. The composition and thicknesses of these layers are listed in TABLE 2. For the contact metal 50 depositions, photolithography and the ion milling operation, the composite materials on substrate 40 are mounted with an adhesive wax 60 on a mechanical carder 62.

Figure 11:
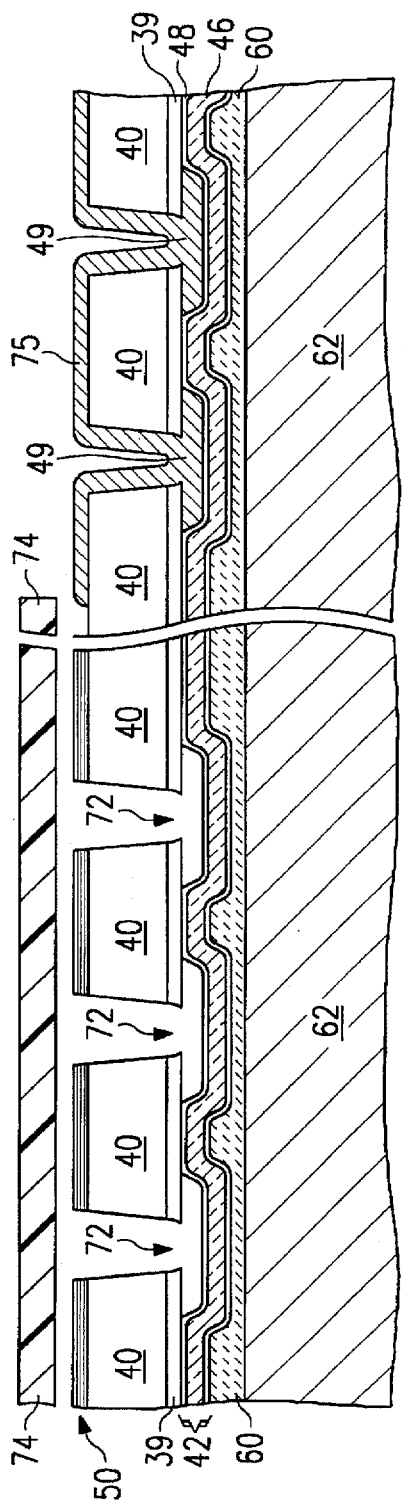
FIG. 11 indicates the bias contact geometries filled with metal by the use of a mask.

In FIG. 11, the tri-level resist 64 (shown in FIG. 10) has been stripped and the organic elevated coating 38 has been cleaned from the trenches 72. A metal mask 74 is used to protect the sensing array while exposing the bias contact vies 73 in which a metal 75 (e.g. indium) is deposited. This bias contact metal 75 makes ohmic contact with metals 49, and 39 and the conducting layer 48 of the optical coating 42.

Figure 12:
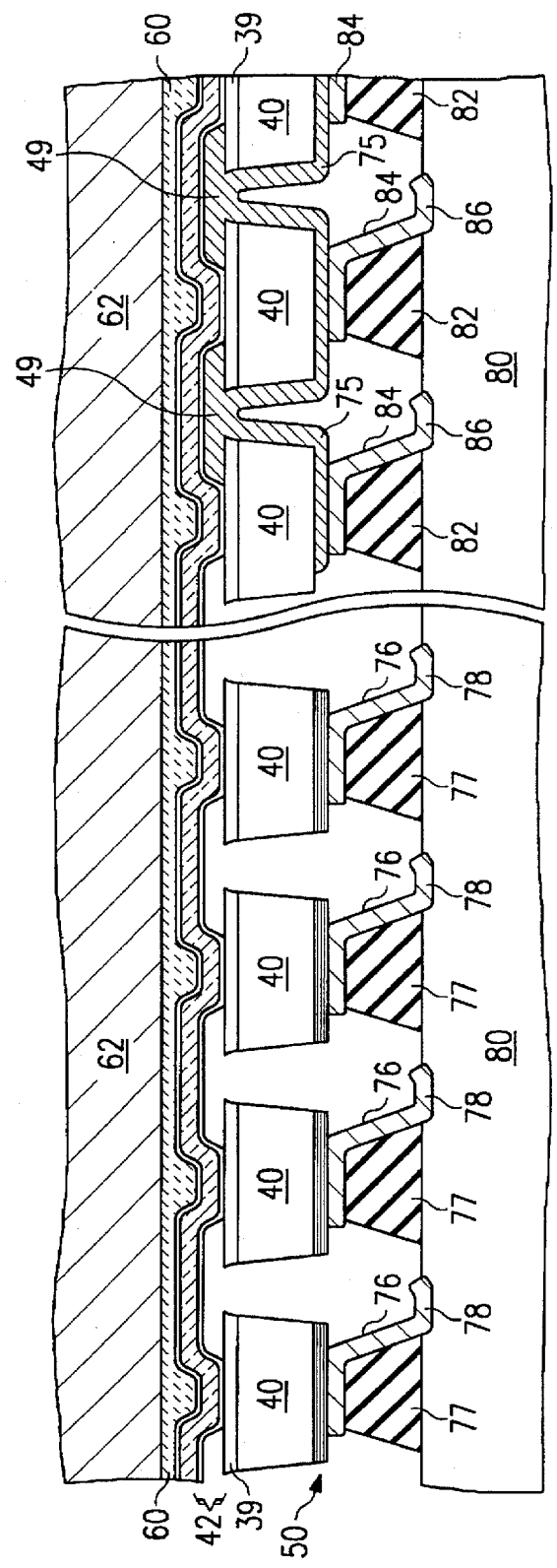
FIG. 12 shows the mounting to the sensing IC to complete the electrical connections to the pixel capacitors and the common electrode bias supply.

In FIG. 12, the numerous electrical connections from the IR sensing array are formed to the companion sensing and biasing IC 80. The pixel connections are made by metal 76 deposited over the IC mesas 77 through the vias 78. The common electrode biasing connection is made from metal 75 to contact metal 84 over the IC mesa 82 through the via 86. However, other methods of connecting the contact metal 84 to the metal 75 work similarly.

This embodiment shows that the bias connection can be made a part of the normal process flow even when the thermal isolation of the pixel capacitors is performed from the back side of the substrate independently of whether there is an elevated optical coating or a common electrode.

While this invention has been described with reference to illustrative embodiments, this description is not intended to be construed in a limiting sense. It should be stressed again that the biasing vies shown in the illustrations were drawn for convenience and ease of description as if they were isolation trench type geometries. These vias are well removed from the sensing area and may be much larger or have many more to cover a more extensive area than shown in the figures. In some embodiments of these novel IR sensors, thermal isolation of the pixel capacitors is performed by partial etching from one side followed by etching to completion on the other side as has been described in the references. All of these methods can have the biasing vias patterned as a normal part of the process flow. In addition, this invention is not to be limited to uncooled infrared detectors. For example, this invention could be easily incorporated into the normal process flow for cooled infrared detectors as well.

Various modifications have already been described but other modifications and combinations of the illustrative embodiments, as well as other embodiments of the invention, will be apparent to persons skilled in the art upon reference to the description. It is therefore intended that the appended claims encompass any such modifications or embodiments.

We claim:

1. A method of forming an electrical contact to an optical coating of an infrared detector, said method comprising:

a. forming a common electrode over a substrate;

b. forming a first elevation layer over portions of said common electrode in a sensing area;

c. forming a second elevation layer over portions of said common electrode in a bias contact area around a periphery of said sensing area;

d. forming said optical coating over said first and said second elevation layers and said common electrode;

e. thinning a backside of said substrate;

f. forming a contact metal on a backside of said substrate;

g. forming a first mask over said contact metal;

h. etching said contact metal, said substrate, and said first and second elevation layers to produce thermal isolation trenches throughout said detector and biasing vias around said periphery of said detector;

i. removing said first mask and said first elevation layer from said detector;

j. forming a second mask over said thermal isolation trenches;

k. forming a bias metal in said biasing vias; and l. removing said second mask from said detector.

2. The method of claim 1, wherein said etching said contact metal, said substrate and said elevation layer includes ion milling.

3. The method of claim 2, wherein said second elevation layer is removed with said first elevation layer.

4. The method of claim 3, wherein said method further includes filling a vacancy of said second elevation layer with said contact metal when said contact metal is formed.

5. The method of claim 3, wherein said method further includes filling a vacancy of said second elevation layer with said bias contact metal when said bias contact metal is formed.

6. The method of claim 2, wherein said depositing a second elevation layer includes depositing a metal to form said second elevation layer.

* * * * *